US011293975B2

(12) United States Patent
Lou

(10) Patent No.: US 11,293,975 B2
(45) Date of Patent: Apr. 5, 2022

(54) PROBING DEVICE

(71) Applicant: TECAT TECHNOLOGIES (SUZHOU) LIMITED, Suzhou Industrial Park Suzhou (CN)

(72) Inventor: Choon Leong Lou, Singapore (SG)

(73) Assignee: TECAT TECHNOLOGIES (SUZHOU) LIMITED, Suzhou Industrial Park Suzhou (CN)

(*) Notice: Subject to any disclaimer, the term of this patent is extended or adjusted under 35 U.S.C. 154(b) by 40 days.

(21) Appl. No.: 16/745,888

(22) Filed: Jan. 17, 2020

(65) Prior Publication Data
US 2021/0199711 A1 Jul. 1, 2021

(30) Foreign Application Priority Data
Dec. 27, 2019 (CN) .......................... 201911372048.4

(51) Int. Cl.
G01R 31/28 (2006.01)

(52) U.S. Cl.
CPC ................................ G01R 31/2887 (2013.01)

(58) Field of Classification Search
CPC ............ G01R 1/07307; G01R 1/07342; G01R 1/06711; G01R 1/06772; G01R 31/2886; G01R 31/2889; G01R 31/311; G01R 31/2865
See application file for complete search history.

(56) References Cited

U.S. PATENT DOCUMENTS

| 5,198,752 A * | 3/1993 | Miyata ............... G01R 1/07314 165/80.4 |
| 5,541,525 A * | 7/1996 | Wood ...................... H01L 22/20 257/E21.509 |
| 5,952,840 A * | 9/1999 | Farnworth ........... G01R 1/0491 324/756.05 |
| 6,343,369 B1 * | 1/2002 | Saunders ........... G01R 1/07342 324/755.01 |
| 8,960,686 B2 * | 2/2015 | Ferguson ............... B23Q 3/088 279/3 |
| 9,793,186 B1 * | 10/2017 | Seddon .................... H01L 22/12 |
| 2004/0183561 A1 * | 9/2004 | Takekoshi ............. G01R 1/0433 324/750.03 |

(Continued)

FOREIGN PATENT DOCUMENTS

| EP | 1304726 B1 * | 7/2007 | ......... H01L 21/6875 |
| TW | 200910437 A | 3/2009 | |

(Continued)

OTHER PUBLICATIONS

Merrill, What is a Wafer Chuck?,https://blog.semiprobe.com/wafer-chucks (Year: 2017).*

(Continued)

Primary Examiner — Patrick Assouad
Assistant Examiner — Demetrius R Pretlow
(74) Attorney, Agent, or Firm — Muncy, Geissler, Olds & Lowe, P.C.

(57) ABSTRACT

A probing device includes a chuck configured to support a device under test (DUT); and a manipulator or probe card disposed above the chuck and including a plurality of probes protruding from the manipulator towards the chuck, wherein the chuck includes a roughened surface and vacuum suction holes for placement of wafer.

16 Claims, 6 Drawing Sheets

(56) References Cited

U.S. PATENT DOCUMENTS

| | | | | |
|---|---|---|---|---|
| 2004/0227536 A1* | 11/2004 | Sugiyama | G01R 31/2865 | 324/750.03 |
| 2007/0046307 A1* | 3/2007 | Itakura | G01R 31/2865 | 324/750.03 |
| 2007/0205788 A1* | 9/2007 | Natsuhara | H01L 21/68757 | 324/750.03 |
| 2008/0217291 A1 | 9/2008 | Higuma et al. | | |
| 2009/0224372 A1* | 9/2009 | Johnson | H01L 23/49827 | 257/621 |
| 2009/0224410 A1* | 9/2009 | Johnson | H01L 23/147 | 257/774 |
| 2009/0315581 A1* | 12/2009 | Rumiantsev | G01R 31/2886 | 324/750.02 |
| 2010/0052720 A1* | 3/2010 | Lou | G01R 31/2874 | 324/750.08 |
| 2010/0259291 A1* | 10/2010 | Daultier | G01R 31/2865 | 324/755.07 |
| 2011/0277293 A1* | 11/2011 | Kogure | G01R 31/2893 | 29/426.1 |
| 2012/0062262 A1* | 3/2012 | Lee | G01R 31/2893 | 324/757.04 |
| 2013/0075982 A1* | 3/2013 | Simmons | G01R 31/2601 | 279/3 |
| 2013/0201598 A1* | 8/2013 | Ishikawa | B23Q 3/152 | 361/234 |
| 2014/0009184 A1* | 1/2014 | Chang | G01R 31/2853 | 324/757.04 |
| 2015/0028907 A1* | 1/2015 | Shinohara | G01R 31/2886 | 324/750.2 |
| 2015/0145547 A1* | 5/2015 | Yano | H01L 21/6838 | 324/756.02 |
| 2015/0276799 A1* | 10/2015 | Weimer | G01R 31/2621 | 324/756.03 |
| 2015/0362551 A1* | 12/2015 | Saunders | G01R 31/2889 | 438/15 |
| 2016/0047856 A1* | 2/2016 | Hatta | G01R 31/2865 | 324/750.03 |
| 2016/0061882 A1 | 3/2016 | Shinohara et al. | | |
| 2016/0336210 A1* | 11/2016 | Cooke | H01L 21/6833 | |
| 2017/0010315 A1* | 1/2017 | Hironaka | G01R 1/073 | |
| 2017/0138984 A1* | 5/2017 | Noguchi | G01R 1/0408 | |
| 2018/0082882 A1* | 3/2018 | Zelsacher | H01L 21/68757 | |
| 2020/0051877 A1* | 2/2020 | Seddon | H01L 21/78 | |
| 2020/0158775 A1* | 5/2020 | Konishi | H01L 21/68 | |
| 2020/0182929 A1* | 6/2020 | Ozawa | G01R 31/2891 | |
| 2020/0205233 A1* | 6/2020 | Kasai | H01L 21/68757 | |
| 2020/0256916 A1* | 8/2020 | Lee | G01R 31/2887 | |
| 2020/0381319 A1* | 12/2020 | Tang | H01L 21/68 | |
| 2020/0386787 A1* | 12/2020 | Contractor | G01R 1/07378 | |

FOREIGN PATENT DOCUMENTS

| | | | | |
|---|---|---|---|---|
| TW | 201504633 A | 2/2015 | | |
| WO | WO-2019084318 A1 * | 5/2019 | | G01R 1/0466 |

OTHER PUBLICATIONS

Walthy, Vacuum Chuck of Quartz or Ceramics with custom vias distribution from 10um to 1mm, https://walthy.com/vacuum-chuck-of-quartz-or-ceramics/ (Year: 2018).*

Office Action dated Jul. 30, 2021 in TW Application No. 109135051, 7 pages.

* cited by examiner

PROBING DEVICE

TECHNICAL FIELD

The present disclosure relates to a probing device including a chuck configured to support a device under test (DUT) thereon, and particularly relates to the chuck having a roughened surface configured to support the DUT. Further, the present disclosure relates to a method of operating the probing device for probing the DUT disposed on a chuck, and particularly relates to a method of probing the DUT disposed on a roughened surface of the chuck and vacuum suction holes for placement of wafer.

DISCUSSION OF THE BACKGROUND

After fabrication, a semiconductor device, such as a wafer, is tested by a probing device. However, during the fabrication and wafer handling processes, residues, contaminants, particles or chippings may be undesirably produced and dropped onto the semiconductor device. These unwanted materials may reduce a contact between a back side of the wafer and a chuck supporting the wafer as shown in FIG. 1. In addition, a non-flatness of the back side of the wafer may also adversely affect the contact between the back side of the wafer and the chuck. Furthermore, the chuck with a smooth surface may also reduce the contact between the back side of the wafer and the chuck. A good contact between the back side of the wafer and the chuck is necessary, especially when a high electric current (e.g. up to hundreds of amperes) flow is used during the testing. As such, poor contact between the back side of the wafer and the chuck would adversely affect the testing of the semiconductor device. Therefore, accuracy of the testing of the semiconductor device may be decreased.

A further requirement is for probing thin wafer that is used especially in high power transistors, diodes, etc. Thin wafers with air gaps between the backside and chuck will result in breakage due to probing force from the probes. Such thin wafer requires good and proper backing from the chuck onto the back of the wafer to prevent probes contacting the wafer from damaging or breaking the wafer.

Accordingly, there is a continuous need to improve a configuration of the probing device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing device. The probing device includes a chuck configured to support a device under test (DUT); and a manipulator or probe card disposed above the chuck and including a plurality of probes protruding from the manipulator towards the chuck, wherein the chuck includes a roughened surface and vacuum suction holes for placement of wafer.

In some embodiments, the roughened surface is prepared by laser surface roughening operations or any other chemical, mechanical, etc. processes, thereby a surface of the chuck is consistently roughened to become the roughened surface.

In some embodiments, the roughened surface is an oxide-free surface, a nickel plated surface, a gold plated surface, or a surface of any plated material.

In some embodiments, the roughened surface includes a plurality of protrusions protruding from the chuck towards the manipulator or probe card. Alternatively, this can be a dig-in from a flat surface of the chuck. The granularities, roughness, contacting areas, of varying dimensions will depend on the actual operations needs and are all encompassed in this disclosure.

In some embodiments, the plurality of protrusions is consistent in height with each other and can be of varying height or any shape as required by the tests.

In some embodiments, each of the plurality of protrusions has a height of about a sub-micron to about hundreds of microns, and may even be irregular of varying sizes within one chuck to meet different requirements.

In some embodiments, each of the plurality of protrusions includes a protrusion, peak or sharp edge contacting a surface of the DUT.

In some embodiments, the roughened surface includes a plurality of recesses formed into the chuck, wherein the plurality of protrusions and the plurality of recesses are alternately disposed.

In some embodiments, the probing device further includes a plurality of cavities defined by the roughened surface of the chuck and a surface of the DUT facing the roughened surface.

In some embodiments, the surface of the DUT is a substantially planar surface.

In some embodiments, a roughness of the entire roughened surface of the chuck is consistent.

In some embodiments, a first roughness of a first portion of the roughened surface is substantially equal to a second roughness of a second portion of the roughened surface adjacent to the first portion.

In some embodiments, the roughened surface is coated with a metallic material.

In some embodiments, the metallic material includes gold (Au) or nickel (Ni).

In some embodiments, the DUT is a semiconductor device or a wafer.

Another aspect of the present disclosure provides a method of operating a probing device. The method includes providing a chuck including a roughened surface; disposing a device under test (DUT) on the roughened surface of the chuck; providing a manipulator or probe card above the DUT and the chuck: and probing the DUT by a plurality of probes protruding from the manipulator or probe card.

In some embodiments, the disposing of the DUT includes sucking the DUT towards the roughened surface of the chuck.

In some embodiments, the roughened surface is prepared by removing or melting portions of a surface of the chuck using a laser.

In some embodiments, the method further includes modifying a surface of the chuck to form the roughened surface including a plurality of protrusions thereon, or transmitting an electric current to the DUT through the roughened surface of the chuck.

In some embodiments, after the disposing of the DUT, a plurality of cavities are formed by the DUT and the roughened surface of the chuck, and contaminants are disposed within one or more of the plurality of cavities.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

In the present disclosure, a probing device is disclosed. The probing device includes a chuck configured to support a device under test (DUT) and a manipulator or probe card disposed above the chuck. The chuck includes a roughened surface facing the manipulator or probe card. The roughened surface includes several protrusions and several recesses between adjacent protrusions. As such, unwanted material such as dust, residues, contaminants, chippings, etc. can be disposed in the recesses. In other words, the unwanted material is surrounded by the protrusions and thus does not contact the DUT. As a result, presence of the unwanted material between the chuck and the DUT does not affect the testing of the DUT.

Figure 1:
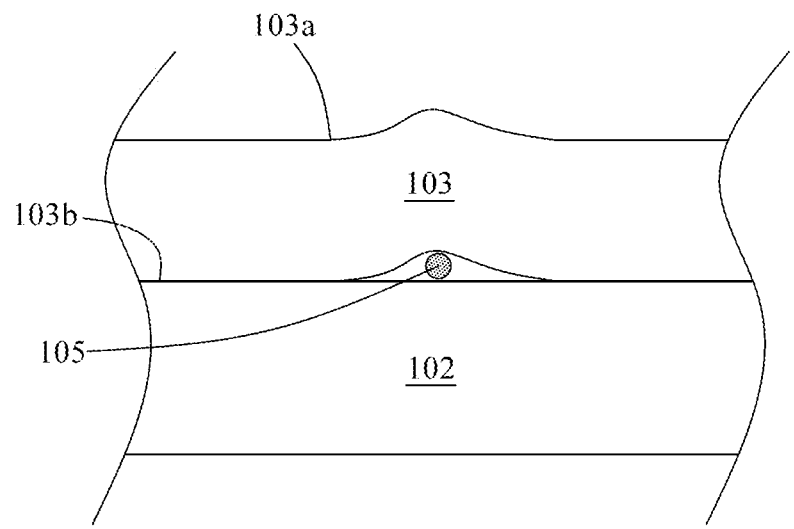
FIG. 1 is a schematic enlarged cross-sectional view of a traditional chuck with a flat surface.
Figure 2:
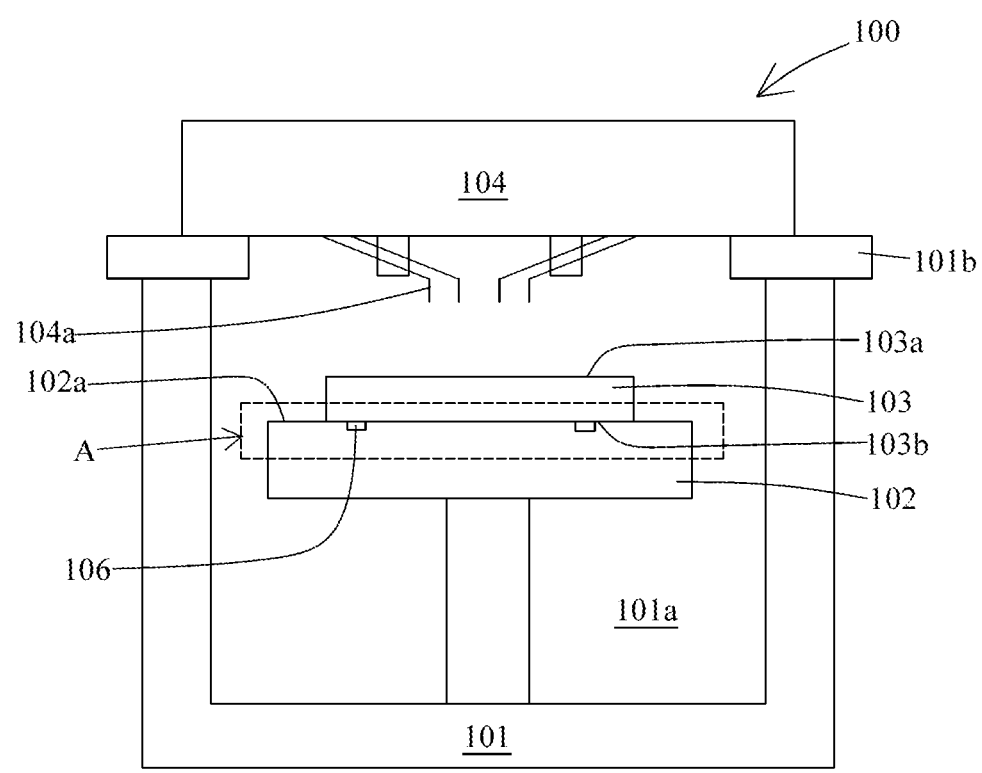
FIG. 2 is a schematic cross-sectional view of a probing device in accordance with some embodiments of the present disclosure.

FIG. 2 is a schematic cross-sectional view of a probing device 100 in accordance with various embodiments of the present disclosure. In some embodiments, the probing device 100 is configured to perform testing of a device under test (DUT) 103. In some embodiments, the probing device 100 includes a housing 101, a chuck 102 disposed within the housing 101, and a manipulator 104 disposed over the chuck 102.

In some embodiments, the housing 101 defines a chamber 101a, and the chuck 102 is disposed in the chamber 101a. In some embodiments, the housing 101 includes a platen 101b over the top of the housing 101. In some embodiments, the platen 101b is a platform for holding and supporting the manipulator 104 or probe card thereon. In some embodiments, the platen 101b includes a flat surface for supporting the manipulator 104 or probe card thereon.

In some embodiments, the chuck 102 is configured to hold and support the DUT 103. In some embodiments, the chuck 102 is rotatable about a center of the chuck 102 and is movable towards and away from the manipulator 104 or probe card. In some embodiments, the chuck 102 has a circular, quadrilateral or polygonal shape.

In some embodiments, the DUT 103 is disposed on the chuck 102 during probing or testing operations. In some embodiments, the DUT 103 is held on the chuck 102 by sucking the DUT 103 towards the chuck 102. In some embodiments, the DUT 103 is drawn towards the chuck 102 using vacuum. In some embodiments, the DUT 103 is held on the chuck 102 by vacuum suction. In some embodiments, a vacuum suction hole 106 is configured to suck the DUT 103 towards the chuck 102, such that the DUT 103 can be placed on the chuck 102. In some embodiments, the DUT 103 includes circuitry formed thereon. In some embodiments, several test pads for testing operations are formed over the DUT 103.

In some embodiments, the DUT 103 includes a front side 103a and a back side 103b opposite to the front side 103a. In some embodiments, circuitry or a device is formed over the front side 103a. In some embodiments, the test pads are formed over the front side 103a. In some embodiments, the back side 103b of the DUT 103 contacts the chuck 102. In some embodiments, the back side 103b is a substantially planar surface. In some embodiments, the DUT 103 is a semiconductor device, a semiconductor structure, a wafer, a chip or the like.

In some embodiments, the manipulator 104 is disposed over the platen 101b and above the chuck 102 and the DUT 103. In some embodiments, the manipulator 104 includes a circuit board for testing the DUT 103. In some embodiments, the manipulator 104 can be a positioner, a probe manipulator, a probe card or the like. In some embodiments, a supporter is disposed on the circuit board, and several probes 104a are fixed on the supporter with epoxy resin and protrude from the manipulator 104 towards the chuck 102. In some embodiments, a tip of each probe 104a is configured to contact the test pad disposed over the DUT 103. In some embodiments, the circuitry of the DUT 103 is electrically connected to the circuit board of the manipulator 104 through the probes 104a.

Figure 3:
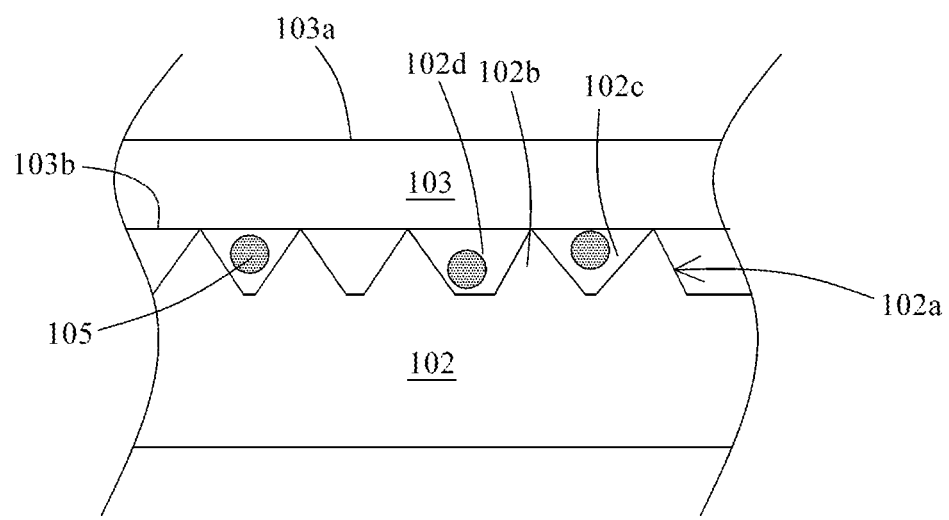
FIG. 3 is a schematic enlarged cross-sectional view of a portion A in FIG. 2.

In some embodiments, the chuck 102 includes a roughened surface 102a for contacting the DUT 103. In some embodiments, the roughened surface 102a is a top surface of the chuck 102 or a portion of the top surface. FIG. 3 illustrates an enlarged view of the roughened surface 102a of the chuck 102. In some embodiments, the roughened surface 102a faces the manipulator 104. In some embodiments, the roughened surface 102a is prepared by laser surface roughening operations, chemical etching, mechanical roughening, or any other suitable surface roughening operations. A surface of the chuck 102 is roughened by the laser surface roughening operations or any other suitable operations to become the roughened surface 102a. In some embodiments, the surface roughening operations provides consistent roughening of the surface of the chuck 102. In some embodiments, the surface of the chuck 102 is roughened consistently to become the roughened surface 102a. In some embodiments, the surface roughening operations forms several sharp edges over the chuck 102. In some embodiments, the roughened surface 102a includes several sharp edges for increasing or improving a contact with the back side 103b of the DUT 103.

In some embodiments, the roughened surface 102a is an oxide-free surface. In some embodiments, the roughened surface 102a of the chuck 102 is coated with a metallic material such as gold, nickel or the like. In some embodiments, the roughened surface 102a is a nickel plated surface, a gold plated surface, a surface of any plated material, or the like. In some embodiments, an electrical signal can be transmitted to the DUT 103 through the chuck 102. In some embodiments, the electrical signal can be transmitted to the back side 103b of the DUT 103 through the roughened surface 102a or the protrusions 102b of the chuck 102.

In some embodiments, the roughened surface 102a includes several protrusions 102b protruding from the chuck 102 towards the manipulator 104. In some embodiments, the protrusions 102b are consistent in height with each other. In some embodiments, the protrusions 102b can be of varying height or any shape as required by the tests. In some embodiments, the protrusion 102b has a height substantially greater than 300 um. In some embodiments, the height of the protrusion 102b is about 100 um to 500 um. In some embodiments, the protrusion 102b has a height of about a sub-micron to about hundreds of microns. In some embodiments, the protrusions 102b may even be irregular of varying sizes within one chuck to meet different requirements. In some embodiments, the protrusion 102b includes a protrusion, a peak configured to contact a surface of the DUT 103. In some embodiments, the peak is in contact with the back side 103b of the DUT 103. In some embodiments, the roughened surface 102a includes several sharp edges configured to contact with the back side 103b of the DUT 103. In some embodiments, the protrusions 102b and the sharp edges are configured to increase or improve a contact with the back side 103b of the DUT 103.

In some embodiments, the roughened surface 102a includes several recesses 102c formed into the chuck 102. In some embodiments, the recesses 102c are consistent in depth with each other. In some embodiments, the recess 102c has a depth substantially greater than 300 um. In some embodiments, the protrusions 102b and the recesses 102c are alternately disposed.

In some embodiments, several cavities 102d are defined by the roughened surface 102a of the chuck 102 and the back side 103b of the DUT 103 facing the roughened surface 102a. In some embodiments, contaminants 105 such as dust, chippings or the like are disposed within the cavity 102d. The roughened surface 102a of the chuck 102 allows the contaminants 105 to be disposed within the cavity 102d, without contacting the back side 103b of the DUT 103. Since the contaminants 105 can be disposed within the cavity 102d, warpage of the DUT 103 can be avoided. Further, the chuck 102 with the roughened surface 102a can improve or increase contact with the DUT 103 or the back side 103b of the DUT 103.

In some embodiments, a roughness of the entire roughened surface 102a of the chuck 102 is consistent. In some embodiments, a first roughness (Ra) of a first portion of the roughened surface 102a is substantially equal to a second roughness of a second portion of the roughened surface 102a adjacent to the first portion. Since the roughened surface 102a is prepared by a laser, the roughness of the entire roughened surface 102a is consistent.

In the present disclosure, a method S200 of operating a probing device 100 is disclosed. In some embodiments, the DUT 103 is tested during performance of the method S200. The method S200 includes a number of operations and the description and illustrations are not deemed as a limitation of the sequence of the operations.

Figure 4:
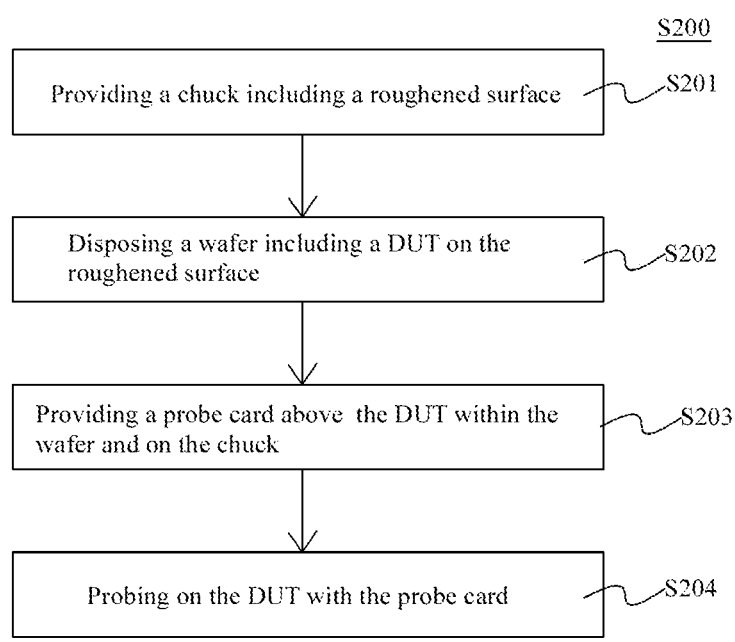
FIG. 4 is a flowchart representing a method of operating a probing device according to aspects of the present disclosure in one or more embodiments.

FIG. 4 is a flowchart depicting an embodiment of the method S200 of operating the probing device 100. The method includes steps S201, S202, S203 and S204. In some embodiments, the steps S201, S202, S203 and S204 are implemented by the probing device 100 described above or illustrated in FIG. 2.

Figure 5:
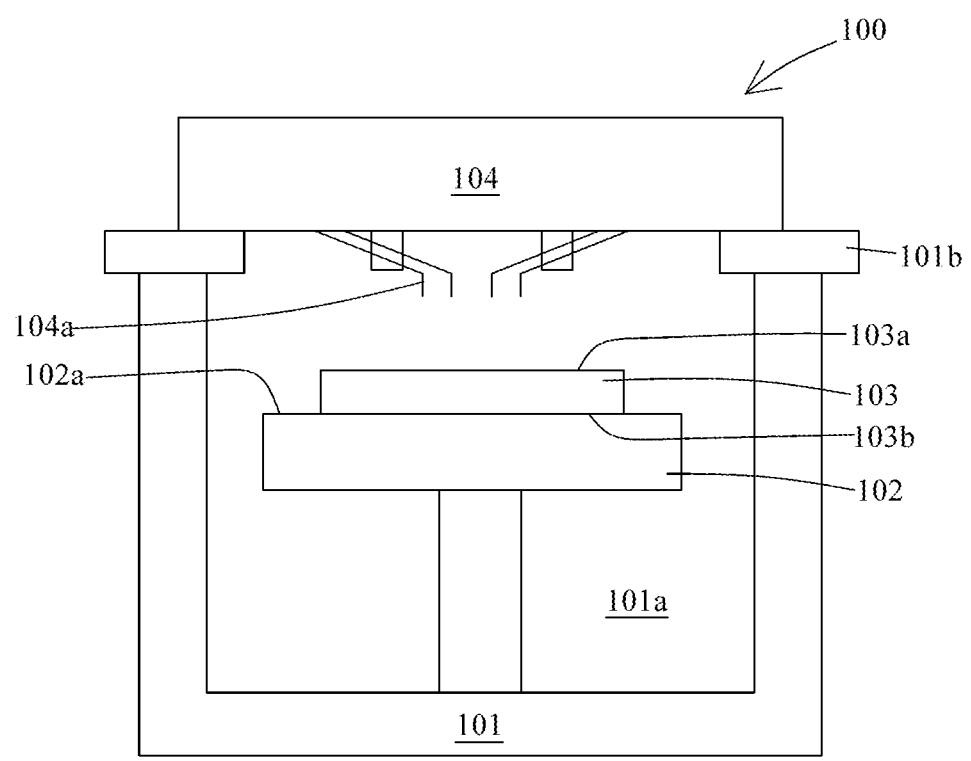
FIGS. 5 to 6 are schematic views of operation of a probing device according to the method of FIG. 4 in accordance with some embodiments of the present disclosure.

In step S201, a chuck 102 including a roughened surface 102a is provided as shown in FIG. 5. In some embodiments, the probing device 100 includes a chuck 102 disposed within a housing 101. In some embodiments, a surface of the chuck 102 is processed by laser surface roughening to become the roughened surface 102a. In some embodiments, the roughened surface 102a is formed by removing several portions of the surface of the chuck 102, or melting several portions of the surface of the chuck 102. In some embodiments, the roughened surface 102a is formed by projecting a laser beam onto the surface of the chuck 102. In some embodiments, the surface of the chuck 102 is modified to become the roughened surface 102a. In some embodiments, the roughened surface 102a includes several protrusions 102b protruding from the chuck 102. In some embodiments, a roughness (Ra) of the entire roughened surface 102a is consistent.

In step S202, a DUT 103 is disposed on the roughened surface 102a of the chuck 102 as shown in FIG. 5. In some embodiments, a wafer including the DUT 103 is disposed on the roughened surface 102a. In some embodiments, the DUT 103 is disposed by sucking the DUT 103 towards the roughened surface 102a of the chuck 102. In some embodiments, the DUT 103 is disposed by drawing the DUT 103 towards the roughened surface 102a of the chuck 102 using vacuum. In some embodiments, a back side 103b of the DUT 103 is in contact with the roughened surface 102a. In some embodiments, contaminants 105 are disposed within a cavity 102d defined by the protrusion 102b and the back side 103b of the DUT 103. The contaminants 105 do not contact the DUT 103, and therefore warpage of the DUT 103 does not develop.

In step S203, a manipulator 104 is provided above the DUT 103 and the chuck 102 as shown in FIG. 5. In some embodiments, the manipulator 104 includes several probes 104a protruding from the manipulator 104 and configured to probe the DUT 103. In some embodiments, the manipulator 104 is disposed above the front side 103a of the DUT 103. In some embodiments, the manipulator 104 such as a probe card is provided above the DUT 103 within the wafer and on the chuck 102.

Figure 6:
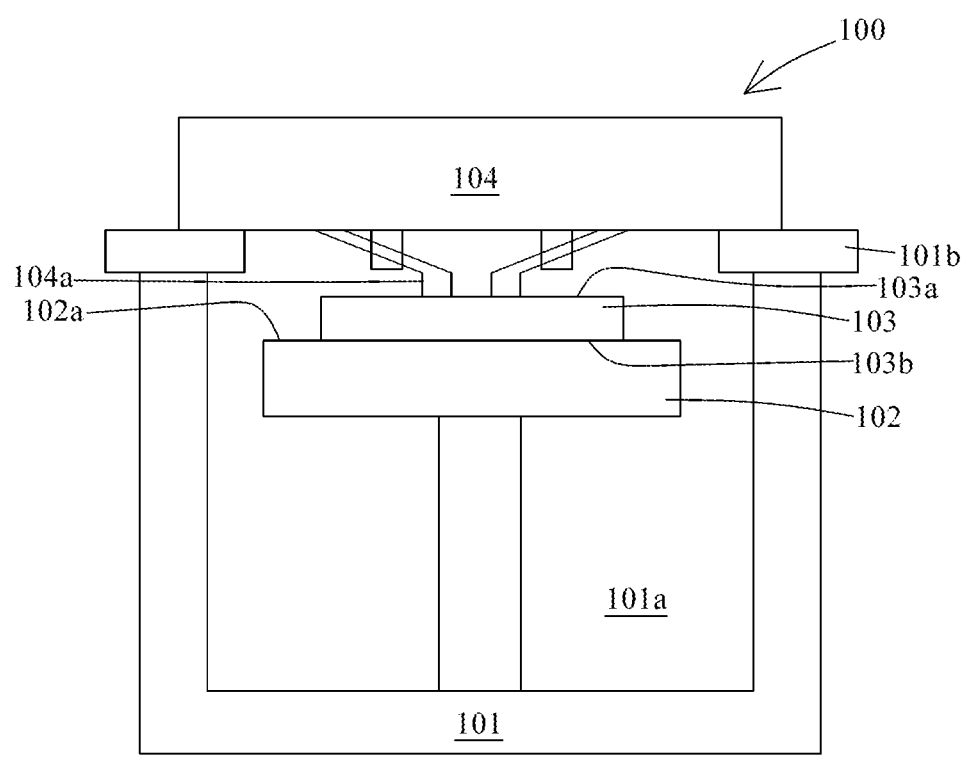

In step S204 the DUT 103 is probed by the probes 104a as shown in FIG. 6. In some embodiments, the probes 104a touch the front side 103a of the DUT 103 for testing the DUT 103. In some embodiments, the DUT 103 is probed by the probe card. In some embodiments, several test pads on the DUT 103 contact the probes 104a correspondingly. In some embodiments, the chuck 102 is raised so as to form an electrical contact between the probes 104a and the DUT 103. During the probing or testing, a testing signal is transmitted to the DUT 103 through the probes 104a, and a response signal from the DUT 103 is transmitted back to the probes 104a. In some embodiments, an electric current is transmitted to the DUT 103 through the roughened surface 102b of the chuck 102 during the testing. In some embodiments, a high electric current (e.g. up to hundreds of amperes) is transmitted to the DUT 103 through the roughened surface 102b of the chuck 102 during the testing.

After completion of the probing or testing, the chuck 102 is lowered and the DUT 103 is displaced away from the probes 104a and the manipulator 104, and then the DUT 103 is unloaded from the chuck 102.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A probing device comprising:
a chuck configured to support a device under test (DUT); and
a manipulator disposed above the chuck and including a plurality of probes protruding from the manipulator towards the chuck,
wherein the chuck includes a roughened surface facing the manipulator, the roughened surface includes a plurality of protrusions protruding from the chuck towards the manipulator, and the plurality of protrusions is consistent in height with each other;
wherein the roughened surface is prepared by laser surface roughening operations or chemical etching, thereby a surface of the chuck is consistently roughened to become the roughened surface.

2. The probing device of claim 1, wherein the roughened surface is an oxide-free surface, a nickel plate surface or a gold plated surface.

3. The probing device of claim 1, wherein each of the plurality of protrusions has a height of about a sub-micron to about hundreds of microns.

4. The probing device of claim 1, wherein each of the plurality of protrusions includes a protrusion, peak or sharp edge contacting a surface of the DUT.

5. The probing device of claim 1, wherein the roughened surface includes a plurality of recesses formed into the chuck, and the plurality of protrusions and the plurality of recesses are alternately disposed.

6. The probing device of claim 1, further comprising a plurality of cavities defined by the roughened surface of the chuck and a surface of the DUT facing the roughened surface.

7. The probing device of claim 6, wherein the surface of the DUT is a substantially planar surface.

8. The probing device of claim 1, wherein a roughness of the entire roughened surface of the chuck is consistent.

9. The probing device of claim 1, wherein a first roughness of a first portion of the roughened surface is substantially equal to a second roughness of a second portion of the roughened surface adjacent to the first portion.

10. The probing device of claim 1, wherein the roughened surface is coated with a metallic material.

11. The probing device of claim 10, wherein the metallic material includes gold (Au) or nickel (Ni).

12. The probing device of claim 1, wherein the DUT is a semiconductor device or a wafer.

13. A method of operating a probing device, comprising:
providing a chuck including a roughened surface, wherein the roughened surface includes a plurality of protrusions protruding from the chuck towards the manipulator, and the plurality of protrusions is consistent in height with each other;
disposing a device under test (DUT) on the roughened surface of the chuck;
providing a manipulator above the DUT and the chuck; and
probing the DUT by a plurality of probes protruding from the manipulator;
wherein the roughened surface is prepared by removing or melting portions of a surface of the chuck using a laser.

14. The method of claim 13, wherein the disposing of the DUT includes sucking the DUT towards the roughened surface of the chuck.

15. The method of claim 13, further comprising:
modifying a surface of the chuck to form the roughened surface including a plurality of protrusions thereon; or
transmitting an electrical current to the DUT through the roughened surface of the chuck.

16. The method of claim 13, wherein after the disposing of the DUT, a plurality of cavities are defined by the roughened surface of the chuck and a surface of the DUT facing the roughened surface, and contaminants are disposed within one or more of the plurality of cavities.

* * * * *